US011901232B2

(12) United States Patent
Balakrishnan et al.

(10) Patent No.: US 11,901,232 B2
(45) Date of Patent: Feb. 13, 2024

(54) AUTOMATIC KERF OFFSET MAPPING AND CORRECTION SYSTEM FOR LASER DICING

(71) Applicant: Applied Materials, Inc., Santa Clara, CA (US)

(72) Inventors: Karthik Balakrishnan, Singapore (SG); Jungrae Park, Santa Clara, CA (US); Zavier Zai Yeong Tan, Singapore (SG); Sai Abhinand, Singapore (SG); James S. Papanu, San Rafael, CA (US)

(73) Assignee: Applied Materials, Inc., Santa Clara, CA (US)

( * ) Notice: Subject to any disclaimer, the term of this patent is extended or adjusted under 35 U.S.C. 154(b) by 496 days.

(21) Appl. No.: 16/908,537

(22) Filed: Jun. 22, 2020

(65) Prior Publication Data

US 2021/0398853 A1    Dec. 23, 2021

(51) Int. Cl.
*H01L 21/78* (2006.01)
*H01L 21/3065* (2006.01)
*H01L 21/027* (2006.01)

(52) U.S. Cl.
CPC .......... *H01L 21/78* (2013.01); *H01L 21/0275* (2013.01); *H01L 21/3065* (2013.01)

(58) Field of Classification Search
CPC ....................... H01L 21/78–86; H01L 21/0275
See application file for complete search history.

(56) References Cited

U.S. PATENT DOCUMENTS

| | | | | |
|---|---|---|---|---|
| 5,521,036 A | * | 5/1996 | Iwamoto | G03F 9/7026 250/548 |
| 6,879,868 B2 | * | 4/2005 | Mos | G03F 9/7084 700/121 |
| 2001/0016293 A1 | * | 8/2001 | Nishi | G03F 9/7046 430/30 |

(Continued)

FOREIGN PATENT DOCUMENTS

| | | |
|---|---|---|
| JP | 2017-130628 | 7/2017 |
| KR | 10-2016-0012801 | 2/2016 |

(Continued)

OTHER PUBLICATIONS

International Search Report and Written Opinion for U.S. Patent Application No. PCT/US2021/033416 dated Sep. 7, 2021, 9 pgs.

(Continued)

*Primary Examiner* — Shaun M Campbell
(74) *Attorney, Agent, or Firm* — Schwabe, Williamson & Wyatt, P.C.

(57) ABSTRACT

Embodiments of the present disclosure include methods of determining scribing offsets in a hybrid laser scribing and plasma dicing process. In an embodiment, the method comprises forming a mask above a semiconductor wafer. In an embodiment, the semiconductor wafer comprises a plurality of dies separated from each other by streets. In an embodiment, the method further comprises patterning the mask and the semiconductor wafer with a laser scribing process. In an embodiment, the patterning provides openings in the streets. In an embodiment, the method further comprises removing the mask, and measuring scribing offsets of the openings relative to the streets.

10 Claims, 10 Drawing Sheets

(56) References Cited

U.S. PATENT DOCUMENTS

| | | | | |
|---|---|---|---|---|
| 2009/0188543 | A1* | 7/2009 | Bann | B23K 26/364 |
| | | | | 219/121.69 |
| 2009/0321399 | A1* | 12/2009 | Inagawa | B23K 26/042 |
| | | | | 219/121.68 |
| 2013/0122687 | A1* | 5/2013 | Holden | H01L 21/78 |
| | | | | 219/385 |
| 2014/0120698 | A1 | 5/2014 | Lei et al. | |
| 2016/0290934 | A1* | 10/2016 | Wells | G06T 7/001 |
| 2016/0343614 | A1* | 11/2016 | Ogawa | H01L 21/6836 |
| 2017/0133256 | A1 | 5/2017 | Zhang et al. | |
| 2018/0342422 | A1* | 11/2018 | Li | H01L 21/02076 |

FOREIGN PATENT DOCUMENTS

| | | | |
|---|---|---|---|
| TW | 2008/22202 | A | 5/2008 |
| WO | WO 2004/109793 | A1 | 12/2004 |

OTHER PUBLICATIONS

International Preliminary Report on Patentability for Patent Application No. PCT/US2021/033416 dated Jan. 5, 2023, 6 pgs.
Official Letter from Taiwan Patent Application No. 110122763 dated Jun. 12, 2023, 8 pgs.

\* cited by examiner

AUTOMATIC KERF OFFSET MAPPING AND CORRECTION SYSTEM FOR LASER DICING

BACKGROUND

1) Field

Embodiments of the present disclosure pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present disclosure include methods of determining scribing offsets in a hybrid laser scribing and plasma dicing process. In an embodiment, the method comprises forming a mask above a semiconductor wafer. In an embodiment, the semiconductor wafer comprises a plurality of dies separated from each other by streets. In an embodiment, the method further comprises patterning the mask and the semiconductor wafer with a laser scribing process. In an embodiment, the patterning provides openings in the streets. In an embodiment, the method further comprises removing the mask, and measuring scribing offsets of the openings relative to the streets.

Embodiments disclosed herein may also include a method of singulating a semiconductor wafer. In an embodiment, the method may comprise forming a mask above a semiconductor wafer, where the semiconductor wafer comprises a plurality of dies separated from each other by streets. In an embodiment, the method may further comprise patterning the mask and semiconductor wafer with a laser scribing process that utilizes a wafer map that has integrated an offset correction. In an embodiment, the patterning provides openings through the mask and into the streets of the semiconductor wafer.

Embodiments disclosed herein may also include a semiconductor substrate. In an embodiment, the semiconductor substrate may comprise a device layer over the semiconductor substrate. In an embodiment, a plurality of dies are in the device layer, and the dies are separated from each other by streets. In an embodiment, the semiconductor substrate may further comprise trenches in the streets, where one or more of the trenches are misaligned with the streets.

DETAILED DESCRIPTION

Figure 1:
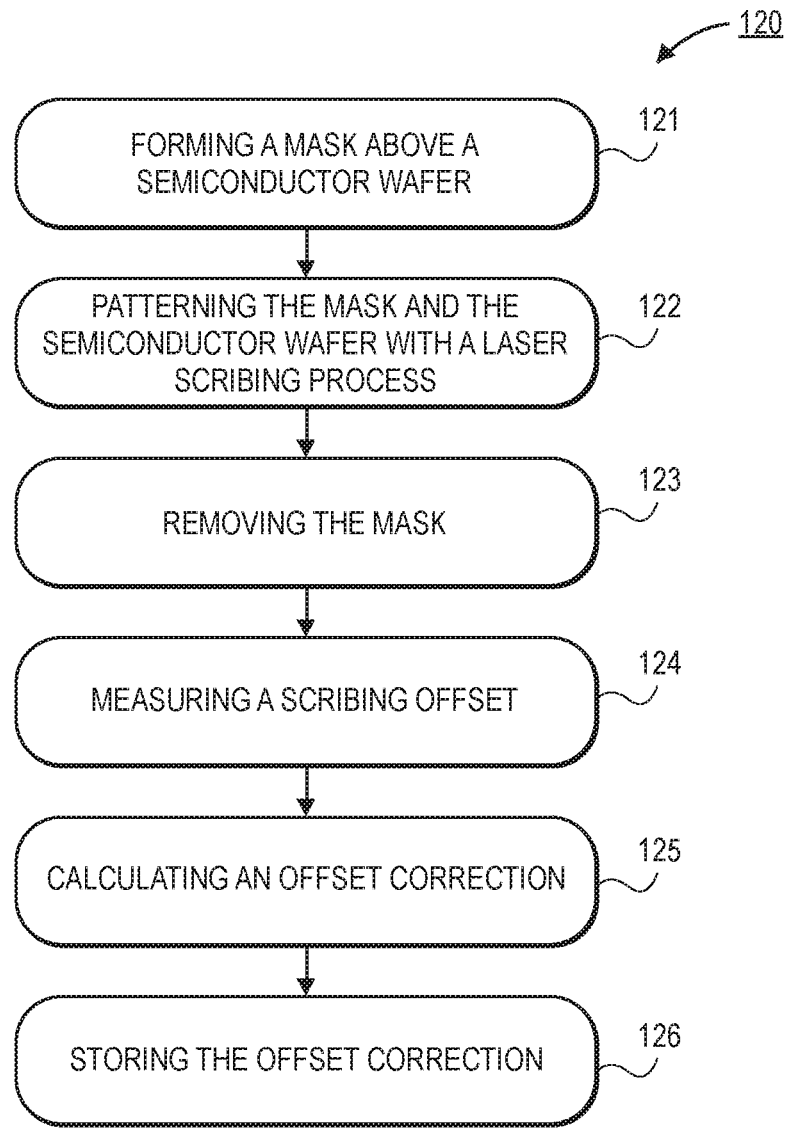
FIG. 1 is a flowchart representing operations for determining offset corrections for a laser scribing process, in accordance with an embodiment.

Methods of dicing semiconductor wafers, each wafer having a plurality of integrated circuits thereon, are described. In the following description, numerous specific details are set forth, such as offset mapping approaches for a hybrid laser and plasma dicing process, in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. More specifically, one or more embodiments are directed to implementing an offset correction of the laser produced scribe line for, e.g., dicing applications.

Automatic offset mapping and correction for laser dicing operations are described herein. In an embodiment, a sacrificial wafer is used to determine offsets of laser scribe lines relative to centerlines of a street between dies. Since laser dicing operations are highly repeatable, the offsets determined on the sacrificial wafer may be used during subsequent laser dicing operations of production wafers. In an embodiment, the sacrificial wafer is substantially similar to the subsequently singulated production wafers. In other embodiments, the sacrificial wafer is a short-loop wafer.

To provide context, a wafer map is used to generate the layout for laser scribe lines in a hybrid wafer or substrate dicing process. After the wafer map is generated, the laser scribing process is implemented. Currently, the scribe line is measured in-situ using machine vision on a coated wafer during the laser scribing process. The determined offset is then applied to subsequently scribed lines, on the fly, to counter the measured offset. In such situations, there may be errors in the measured offset due to the presence of the coating. Particularly, the errors in the offset may be attributable to the refractive effect of the coating. Additionally, the offsets are not typically uniform across the wafer. As such, using offset measurements of a single scribe line is not an accurate way to account for offsets in subsequent scribe lines.

Misaligned scribe lines may result in the scribe line being too close to an edge of the die. When the scribe line is too close to the edge of the die, chipping and/or other damage attributable to the singulation process may damage the integrated circuitry of the die. Accordingly, improperly aligned scribe lines lead to a reduction in die yield from the wafer. In order to account for misaligned scribe lines, the width of streets between dies may be increased. However, this decreases the usable area of the wafer and decreases the number of dies per wafer. Accordingly, advantages to implementing one or more embodiments described herein may include one or more of: (1) more accurately aligned scribe lines; (2) increased die density on wafer, and/or (3) higher wafer yield.

Embodiments of the present disclosure may include a process for determining offsets of scribe lines across an entire wafer. Particularly, the offsets are determined on a sacrificial wafer, and the measured offsets may then be applied to subsequently singulated production wafers. The offsets measured in accordance with embodiments disclosed herein are more accurate than in-situ measurements described above because the coating (i.e., mask layer) is removed before measurement occurs. As such, there are no refraction errors in the measurement. Additionally, in some embodiments the offset error of each scribe line on the wafer may be measured. This allows for each scribe line to be independently adjusted and provides more accurate alignment across the wafer.

Figure 2A:
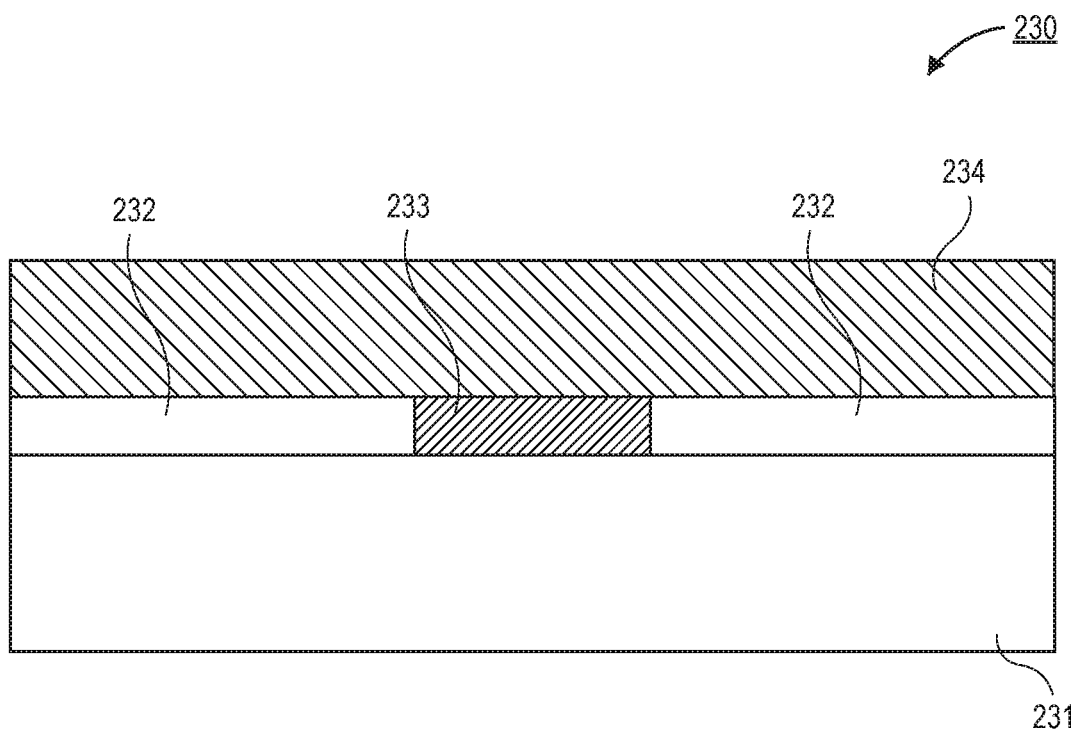
FIGS. 2A-2C are cross-sectional illustrations depicting a process for determining offset corrections for a laser scribing process, in accordance with an embodiment.
Figure 2B:
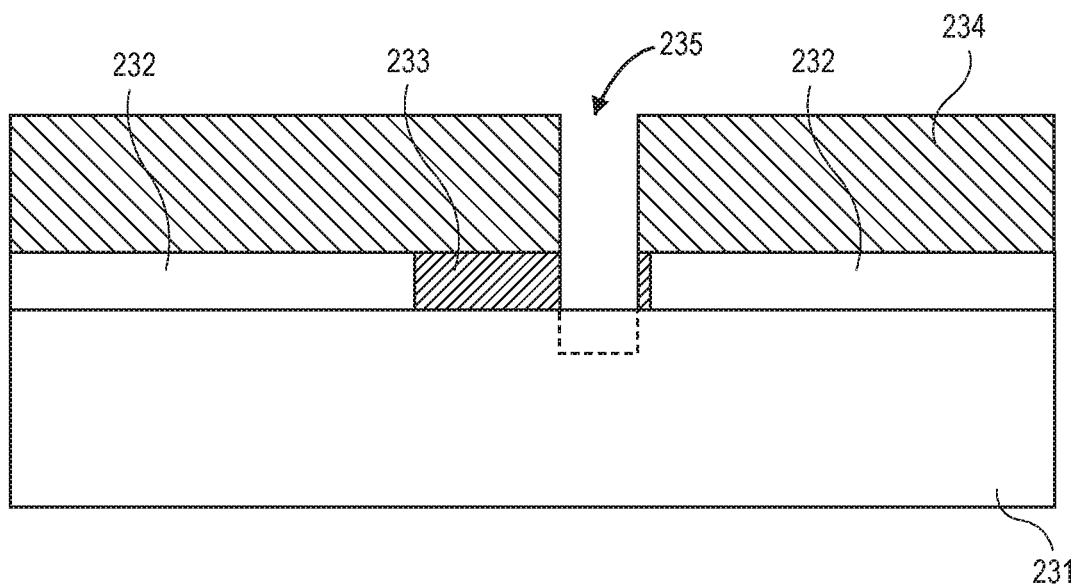
Figure 2C:
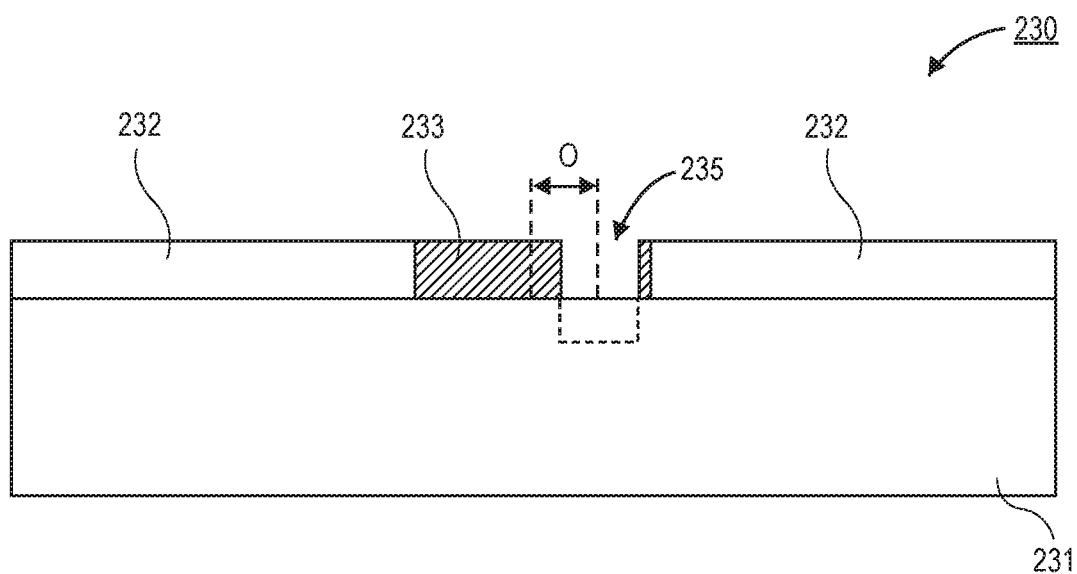

In accordance with one or more embodiments of the present disclosure, a method for determining an offset correction of scribe lines on a semiconductor wafer including integrated circuits is provided. FIG. 1 is a flowchart 120 representing operations in a method of determining scribe line offsets for a semiconductor wafer including a plurality of integrated circuits, in accordance with an embodiment of the present disclosure. FIGS. 2A-2C illustrate cross-sectional views of a semiconductor wafer including a plurality of integrated circuits during performing of a method for determining an offset correction of scribe lines on a semiconductor wafer, corresponding to operations of flowchart 120, in accordance with an embodiment of the present disclosure.

Referring to operation 121 of flowchart 120, and corresponding FIG. 2A, a mask 234 is formed above a semiconductor wafer or substrate 231. The mask 234 is composed of a layer covering and protecting integrated circuits 232 formed on the surface of semiconductor wafer 231. The mask 234 also covers intervening streets 233 formed between each of the integrated circuits 232.

In accordance with an embodiment of the present disclosure, forming the mask 234 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultraviolet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In another embodiment, forming the mask 234 involves forming a layer deposited in a plasma deposition process. For example, in one such embodiment, the mask 234 is composed of a plasma deposited Teflon or Teflon-like (polymeric $CF_2$) layer. In a specific embodiment, the polymeric $CF_2$ layer is deposited in a plasma deposition process involving the gas $C_4F_8$.

In another embodiment, forming the mask 234 involves forming a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, forming the mask 232 involves forming a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, semiconductor wafer or substrate 231 is composed of a material suitable to withstand a fabrication process and upon which semiconductor processing layers may suitably be disposed. For example, in one embodiment, semiconductor wafer or substrate 231 is composed of a group IV-based material such as, but not limited to, crystalline silicon, germanium or silicon/germanium. In a specific embodiment, providing semiconductor wafer 231 includes providing a monocrystalline silicon substrate. In a particular embodiment, the monocrystalline silicon substrate is doped with impurity atoms. In another embodiment, semiconductor wafer or substrate 204 is composed of a III-V material such as, e.g., a III-V material substrate used in the fabrication of light emitting diodes (LEDs).

In an embodiment, semiconductor wafer or substrate 231 has disposed thereon or therein, as a portion of the integrated circuits 232, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 232. Materials making up the streets 233 may be similar to or the same as those materials used to form the integrated circuits 232. For example, streets 233 may be composed of layers of dielectric materials, semiconductor materials, and metallization. In one embodiment, one or more of the streets 233 includes test devices similar to the actual devices of the integrated circuits 232.

Referring to operation 122 of flowchart 120, and corresponding FIG. 2B, the mask 234 is patterned with a laser scribing process to provide a patterned mask 234 with gaps 235, exposing regions of the semiconductor wafer or substrate 231 between the integrated circuits 232. As such, the laser scribing process is used to remove the material of the streets 233 originally formed between the integrated circuits 232. In accordance with an embodiment of the present disclosure, patterning the mask 234 with the laser scribing process includes forming trenches 235 partially into the regions of the semiconductor wafer 231 between the integrated circuits 232, as depicted by the dashed line in FIG. 2B.

In an embodiment, the laser scribing process involves using a Gaussian source laser beam. In one such embodiment, the laser scribing process involves using a femtosecond source laser beam. For example, in an embodiment, a laser with a wavelength in the visible spectrum plus the ultra-violet (UV) and infra-red (IR) ranges (totaling a broadband optical spectrum) is used to provide a femtosecond-based laser pulse, which has a pulse width on the order of the femtosecond ($10^{-15}$ seconds). In one embodiment, ablation is not, or is essentially not, wavelength dependent and is thus suitable for complex films such as films of the mask 234, the streets 233 and, possibly, a portion of the semiconductor wafer or substrate 231.

Laser parameters selection, such as beam profile, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns or between 10-15 microns.

In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth.

Referring to operation 123 of flowchart 120, and corresponding FIG. 2C, the mask 234 is removed. The mask 234 may be removed with any suitable process, depending on the material used for the mask 234. In a particular embodiment, the mask 234 may be removed with an ashing process or with exposure to a solution suitable for dissolving the mask 234. In the case of a UV curable mask, the mask 234 may be exposed to UV light prior to removal. After the mask 234 is removed, an offset O of the opening 235 relative to the street 233 is measured. For example, the offset O may be a measure of the offset of a centerline of the opening 235 relative to a centerline of the street 233. Such an offset may be referred to as a translational offset. However, it is to be appreciated that other offset types may also be measured. For example, the offset may be an angular offset in some embodiments. Angular offsets are described in greater detail below. In an embodiment, the measurement may be made using machine vision capabilities that are integrated with the laser scribing tool. In an alternative embodiment, the machine vision used to measure the offsets may be provided in a tool other than the laser scribing tool.

Referring to operation 125 of flowchart 120, an offset correction is calculated. The offset correction is a correction parameter that may be added to a wafer map in order to account for the measured offset. In an embodiment, operation 126 of flowchart 120 may include storing the offset correction. The offset correction may be stored in a memory and be used in subsequent laser scribing of production wafers.

Figure 3A:
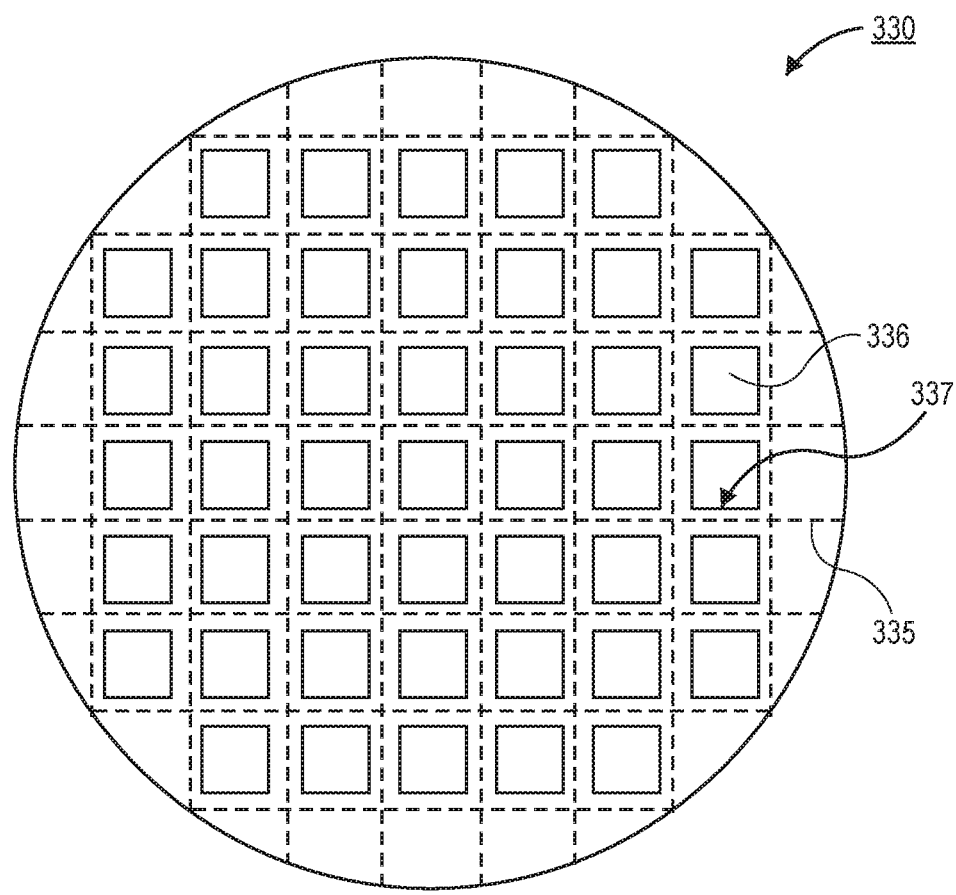
FIG. 3A is a plan view illustration of a wafer with a plurality of dies separated by streets, where scribe lines are provided along the streets, in accordance with an embodiment.

Referring now to FIG. 3A, a plan view illustration of a wafer 330 is shown, in accordance with an embodiment. The wafer 330 may comprise a plurality of dies 336 that are distributed across a surface of the wafer 330. The dies 336 may be spaced apart from each other by streets 337. The wafer 330 is a sacrificial wafer. That is, the wafer 330 may be used to provide offset correction values for scribe lines 335. The wafer 330 may not be processed further (e.g., the wafer 330 may not be singulated after the scribe lines 335 are formed).

In some embodiments, the wafer 330 is substantially similar to production wafers that will be subsequently singulated. In other embodiments, the wafer 330 is a short-loop wafer. A short-loop wafer is a wafer that has been fabricated with a subset of the processing operations used to provide production wafers. For example, the short-loop wafer may include the structures with dimensions equal to those of dies in production wafers. The short-loop wafer may also comprise bumps on the dies 336. The use of a short-loop wafer allows for a decrease in the cost of fabrication since a production wafer does not need to be sacrificed in order to provide offset measurements.

In an embodiment, laser scribe lines 335 have been provided in the streets 337 of the wafer 330. The laser scribe lines 335 may be measured to determine any offsets from the streets 337 using a process similar to the process described in the flowchart 120 above. In an embodiment, all of the scribe lines 335 on the wafer are measured to provide offset corrections for the entire wafer 330. In other embodiments, a subset of the scribe lines 335 are measured to provide offset corrections.

Figure 3B:
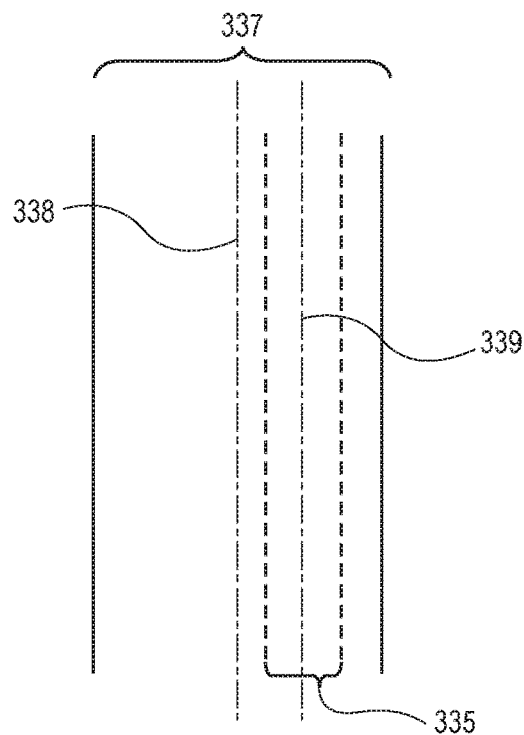
FIG. 3B is a plan view illustration of a scribe line with a translational offset from a centerline of the street, in accordance with an embodiment.
Figure 3C:
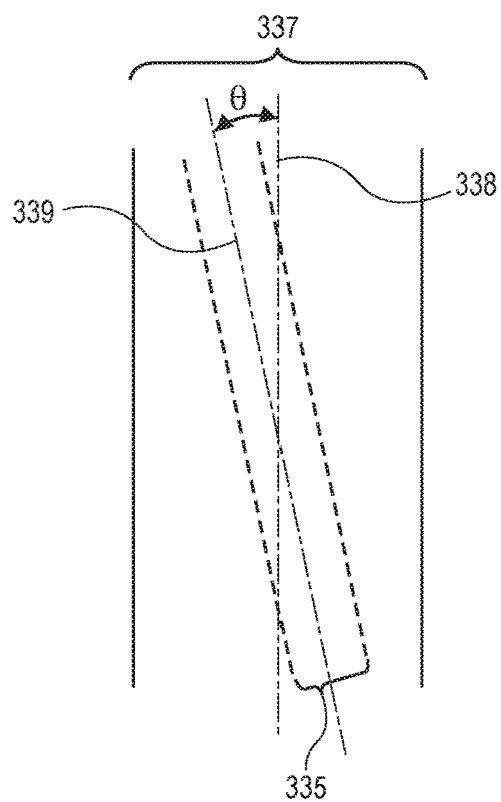
FIG. 3C is a plan view illustration of a scribe line with an angular offset from a centerline of the street, in accordance with an embodiment.
Figure 3D:
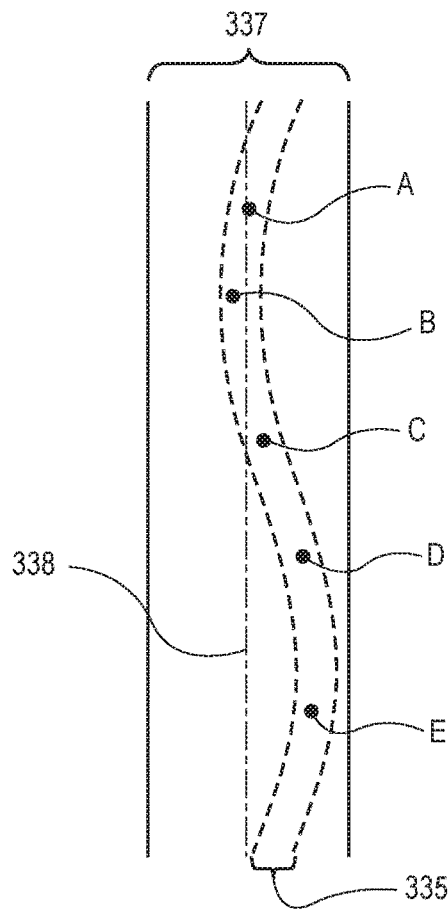
FIG. 3D is a plan view illustration of a nonlinear scribe line in a street, in accordance with an embodiment.

Referring now to FIGS. 3B-3D, a series of plan view illustrations depicting different categories of offsets are shown, in accordance with various embodiments.

Referring now to FIG. 3B, a translational offset is shown, in accordance with an embodiment. As shown, the centerline 339 of the scribe line 335 is offset laterally from the centerline 338 of the street 337. In such an embodiment, the offset correction may include moving the scribe line 335 laterally in order to align the centerline 339 of the scribe line 335 with the centerline 338 of the street 337.

Referring now to FIG. 3C, an angular offset is shown, in accordance with an embodiment. As shown, the centerline 339 of the scribe line 335 is rotationally offset from the centerline 338 of the street 337 by an angle θ. In such an embodiment, the offset correction may include rotating the scribe line 335 by the angle θ in order to align the centerline 339 of the scribe line 335 with the centerline 338 of the street 337.

In FIGS. 3B and 3C a single type of offset is provided (i.e., a translational offset in FIG. 3B and an angular offset in FIG. 3C). However, it is to be appreciated that the offset may also include both a translational offset and an angular offset in some embodiments.

Referring now to FIG. 3D, a plan view illustration of a scribe line 335 in a street 337 is shown, in accordance with an additional embodiment. As shown, the scribe line 335 may have a non-linear shape. For example, the scribe line 335 in FIG. 3D has an S-shaped pattern. In such embodiments, the offset may be determined by measuring the offset at a plurality of locations and determining an average offset. For example, offsets at points A-E along the length of the scribe line 335 may be measured, and the average offset of points A-E may be used to provide an average offset of the scribe line 335. The average offset may include one or both of a translational offset and an angular offset.

Figure 4:
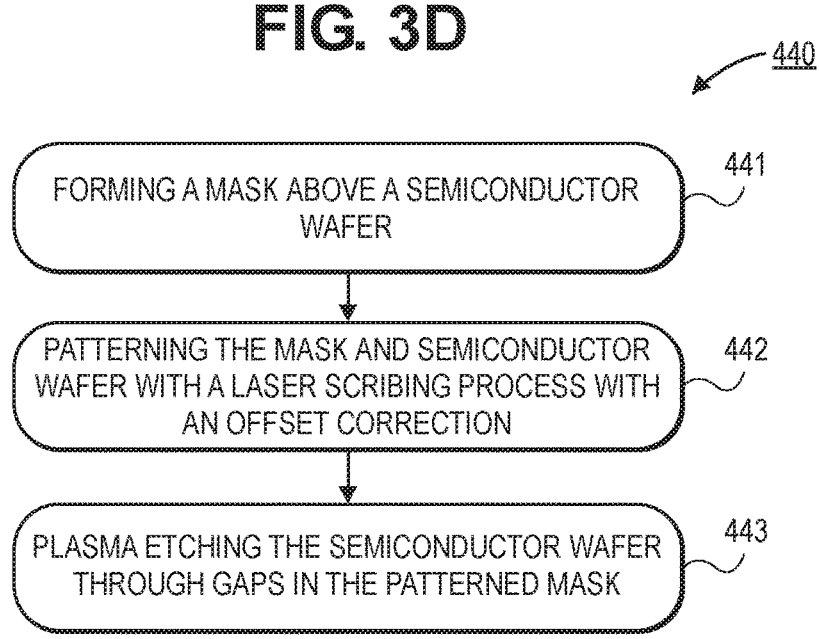
FIG. 4 is a flowchart representing operations for singulating a semiconductor wafer, in accordance with an embodiment.
Figure 5A:
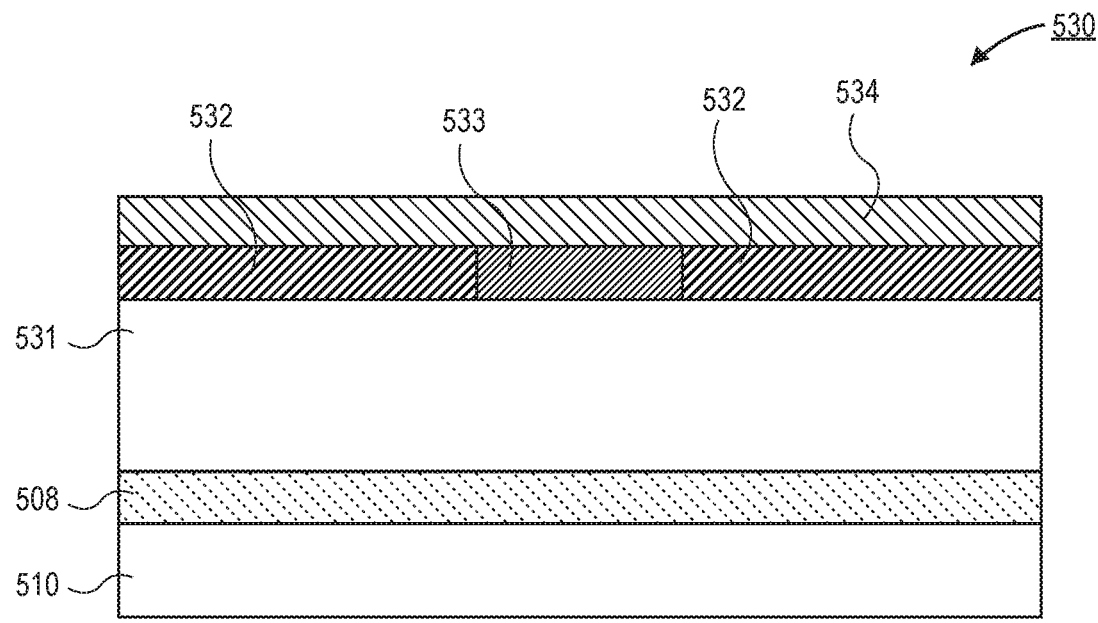
FIGS. 5A-5C are cross-sectional illustrations depicting a process for singulating a semiconductor wafer using a wafer map with offset corrections, in accordance with an embodiment.
Figure 5B:
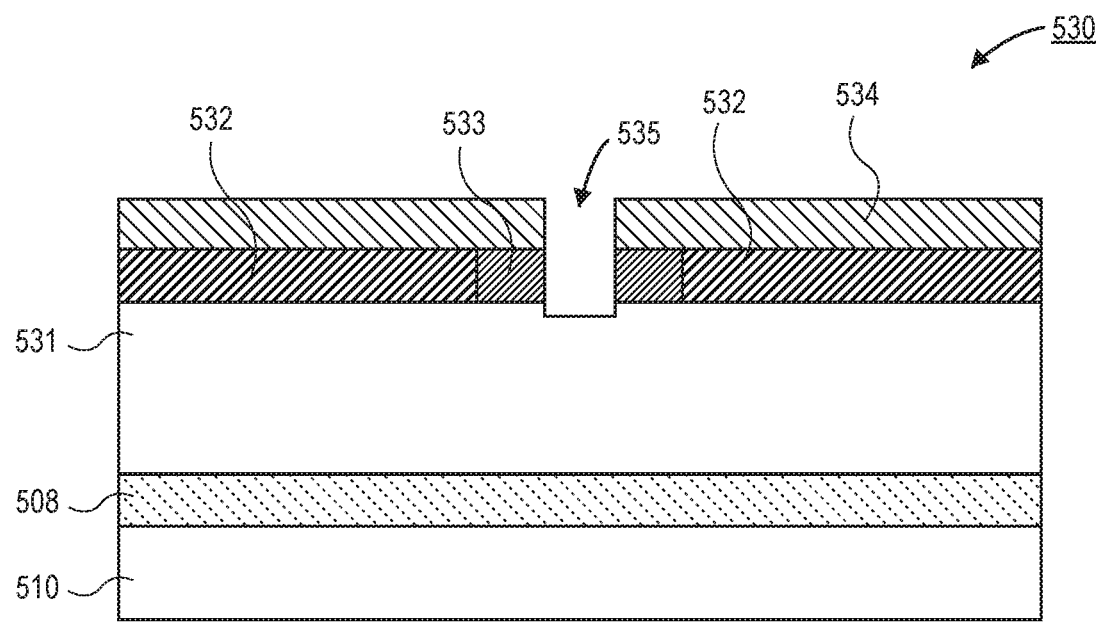
Figure 5C:
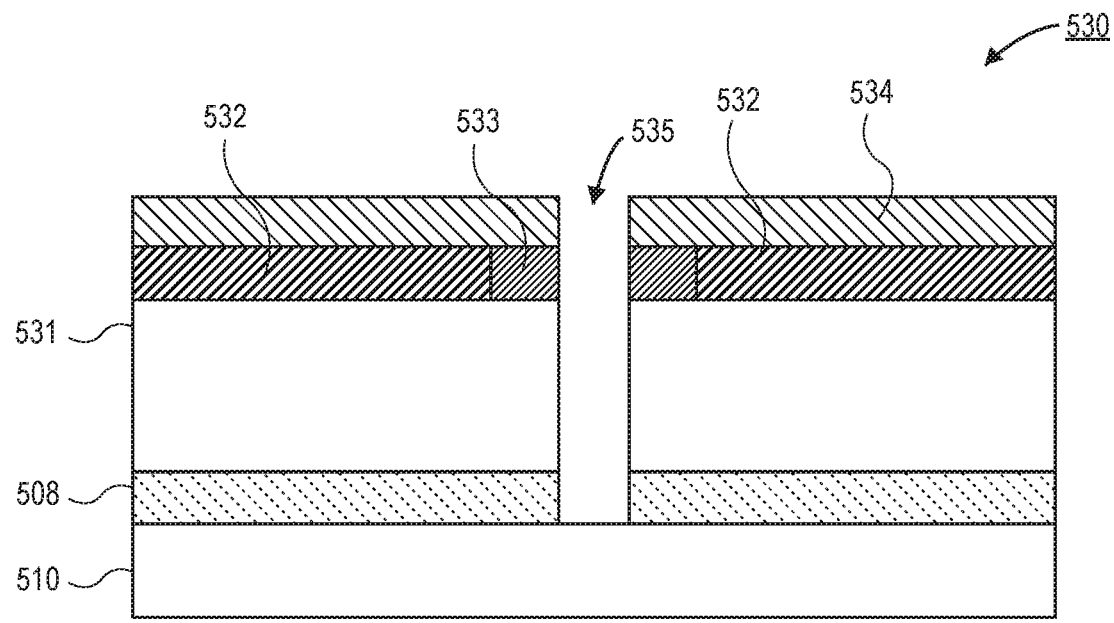

In accordance with one or more embodiments of the present disclosure, a method for dicing a semiconductor wafer including integrated circuits using offset corrections is provided. FIG. 4 is a flowchart 440 representing operations in a method of dicing a semiconductor wafer including a plurality of integrated circuits, in accordance with an embodiment of the present disclosure. FIGS. 5A-5C illustrate cross-sectional views of a semiconductor wafer including a plurality of integrated circuits during performing of a method of dicing the semiconductor wafer, corresponding to operations of flowchart 440, in accordance with an embodiment of the present disclosure.

Referring to operation 441 of flowchart 440, and corresponding FIG. 5A, a mask layer 534 is formed above a semiconductor wafer to provide a materials stack 530 for hybrid laser ablation and plasma etch dicing. In an embodiment, the materials stack 530 includes a mask layer 534, a device layer 532, and a substrate 531. The mask layer, device layer, and substrate are disposed above a die attach film 508 which is affixed to a backing tape 510. In an embodiment, the mask layer 534 is a water soluble layer such as the water soluble layers described above in association with mask 234. The device layer 532 includes an inorganic dielectric layer (such as silicon dioxide) disposed above one or more metal layers (such as copper layers) and one or more low K dielectric layers (such as carbon-doped oxide layers). The device layer 532 also includes streets 533 arranged between integrated circuits, the streets including the same or similar layers to the integrated circuits. The substrate 531 is a bulk single-crystalline silicon substrate.

In an embodiment, the bulk single-crystalline silicon substrate 531 is thinned from the backside prior to being affixed to the die attach film 508. The thinning may be performed by a backside grind process. In one embodiment, the bulk single-crystalline silicon substrate 531 is thinned to a thickness approximately in the range of 50-100 microns. It is important to note that, in an embodiment, the thinning is performed prior to a laser ablation and plasma etch dicing process. In an embodiment, the photo-resist layer 534 has a thickness of approximately 5 microns and the device layer 532 has a thickness approximately in the range of 2-3 microns. In an embodiment, the die attach film 508 (or any suitable substitute capable of bonding a thinned or thin wafer or substrate to the backing tape 510) has a thickness of approximately 20 microns.

Referring to operation 442 of flowchart 440, and corresponding FIG. 5B, the mask layer 534 and semiconductor wafer are patterned with a laser scribing process with an offset correction. In an embodiment, the offset correction may have been determined using a sacrificial wafer prior to the dicing of the materials stack 530 (e.g., using a process such as the process described in flowchart 120). Accordingly, the patterned trenches 535 may be substantially aligned with the street 533. In an embodiment, operation 442 may include patterning the mask 534, the device layer 532 and a portion of the substrate 531 with a laser scribing process to form trenches 535 in the substrate 531.

Referring to operation 443, and corresponding FIG. 5C, a through-silicon deep plasma etch process is used to extend the trench 535 down to the die attach film 508, exposing the top portion of the die attach film 508 and singulating the silicon substrate 531. The device layer 532 is protected by the mask layer 534 during the through-silicon deep plasma etch process. In an embodiment, the singulation process may further include patterning the die attach film 508, exposing the top portion of the backing tape 510 and singulating the die attach film 508. In an embodiment, the die attach film is singulated by a laser process or by an etch process. Further embodiments may include subsequently removing the singulated portions of substrate 531 (e.g., as individual integrated circuits) from the backing tape 510. In one embodiment, the singulated die attach film 508 is retained on the back sides of the singulated portions of substrate 531. Other embodiments may include removing the mask layer 534 from the device layer 532.

In an embodiment, etching the substrate 531 includes using a plasma etching process. In one embodiment, a through-silicon via type etch process is used. For example, in a specific embodiment, the etch rate of the material of substrate 531 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, CA, USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate 531 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally includes a fluorine-based gas such as $SF_6$, $C_4F_8$, $CHF_3$, $XeF_2$, or any other reactant gas capable of etching silicon at a relatively fast etch rate. In another embodiment, the plasma etching operation described in association with FIG. 5C employs a conventional Bosch-type dep/etch/dep process to etch through the substrate 531. Generally, a Bosch-type process consists of three sub-operations: deposition, a directional bombardment etch, and isotropic chemical etch which is run through many iterations (cycles) until silicon is etched through.

Accordingly, referring again to flowchart 440 and FIGS. 5A-5C, wafer dicing may be performed by initial ablation using an laser scribing process to ablate through a mask layer, through wafer streets (including metallization), and partially into a silicon substrate. Die singulation may then be completed by subsequent through-silicon deep plasma etching.

Figure 6:
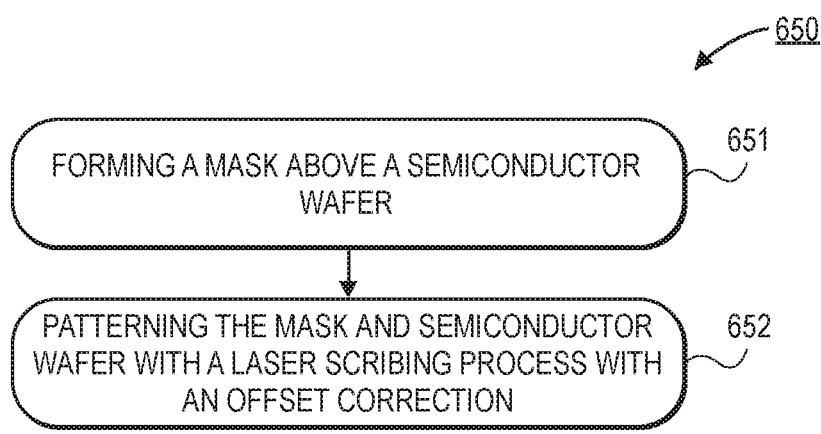
FIG. 6 is a flowchart representing operations for singulating a semiconductor wafer, in accordance with an embodiment.
Figure 7A:
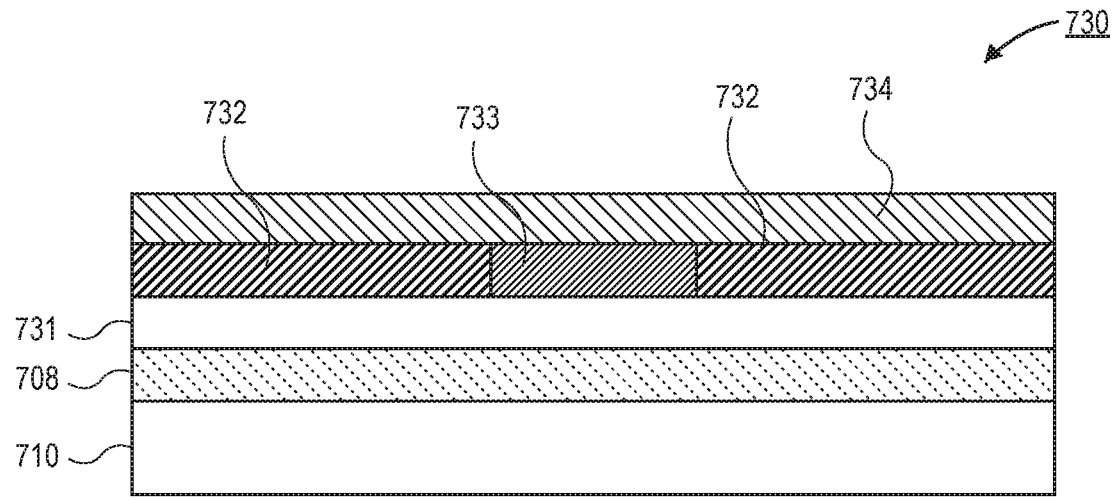
FIGS. 7A and 7B are cross-sectional illustrations depicting a process for singulating a semiconductor wafer using a wafer map with offset corrections, in accordance with an embodiment.
Figure 7B:
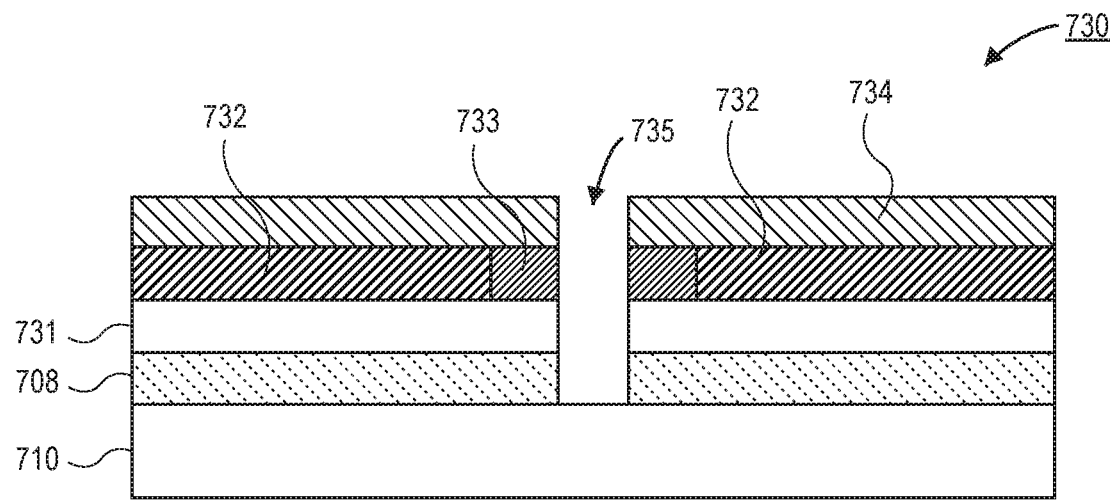

In accordance with one or more embodiments of the present disclosure, a method for dicing a semiconductor wafer including integrated circuits using offset corrections is provided. FIG. 6 is a flowchart 650 representing operations in a method of dicing a semiconductor wafer including a plurality of integrated circuits, in accordance with an embodiment of the present disclosure. FIGS. 7A-7B illustrate cross-sectional views of a semiconductor wafer including a plurality of integrated circuits during performing of a method of dicing the semiconductor wafer, corresponding to operations of flowchart 650, in accordance with an embodiment of the present disclosure.

Referring to operation 651 of flowchart 650, and corresponding FIG. 7A, a mask layer 734 is formed above a semiconductor wafer to provide a materials stack 730 for hybrid laser ablation and plasma etch dicing. In an embodiment, the materials stack 730 includes a mask layer 734, a device layer 732, and a substrate 731. The mask layer, device layer, and substrate are disposed above a die attach film 708 which is affixed to a backing tape 710. In an embodiment, the mask layer 734 is a water soluble layer such as the water soluble layers described above in association with mask 234. The device layer 732 includes an inorganic dielectric layer (such as silicon dioxide) disposed above one or more metal layers (such as copper layers) and one or more low K dielectric layers (such as carbon-doped oxide layers). The device layer 732 also includes streets 733 arranged between integrated circuits, the streets including the same or similar layers to the integrated circuits. The substrate 731 is a bulk single-crystalline silicon substrate.

In an embodiment, the bulk single-crystalline silicon substrate 731 is thinned from the backside prior to being affixed to the die attach film 708. The thinning may be performed by a backside grind process. In one embodiment, the bulk single-crystalline silicon substrate 731 is thinned to a thickness approximately less than 50 microns. It is important to note that, in an embodiment, the thinning is performed prior to a laser ablation and plasma etch dicing process. In an embodiment, the photo-resist layer 734 has a thickness of approximately 5 microns and the device layer 732 has a thickness approximately in the range of 2-3 microns. In an embodiment, the die attach film 708 (or any suitable substitute capable of bonding a thinned or thin wafer or substrate to the backing tape 710) has a thickness of approximately 20 microns.

Referring to operation 652 of flowchart 650, and corresponding FIG. 7B, the mask layer 734 and semiconductor wafer are patterned with a laser scribing process with an offset correction. In an embodiment, the offset correction may be have been determined using a sacrificial wafer prior to the dicing of the materials stack 730 (e.g., using a process such as the process described in flowchart 120). Accordingly, the patterned trenches 735 may be substantially aligned with the street 733. In an embodiment, operation 652 may include patterning the mask 734, the device layer 732 and a portion of the substrate 731 with a laser beam laser scribing process to form trenches 735 in the substrate 731.

It is to be appreciated that the dicing or singulation process could be stopped after the above described laser scribing in a case that the laser scribing is used to pattern the mask as well as to scribe fully through the wafer or substrate in order to singulate the dies. Accordingly, further singulation processing would not be required in such a case.

A single process tool may be configured to perform many or all of the operations in a laser beam ablation and plasma etch singulation process. For example, FIG. 8 illustrates a block diagram of a tool layout for laser and plasma dicing of wafers or substrates, in accordance with an embodiment of the present disclosure.

Figure 8:
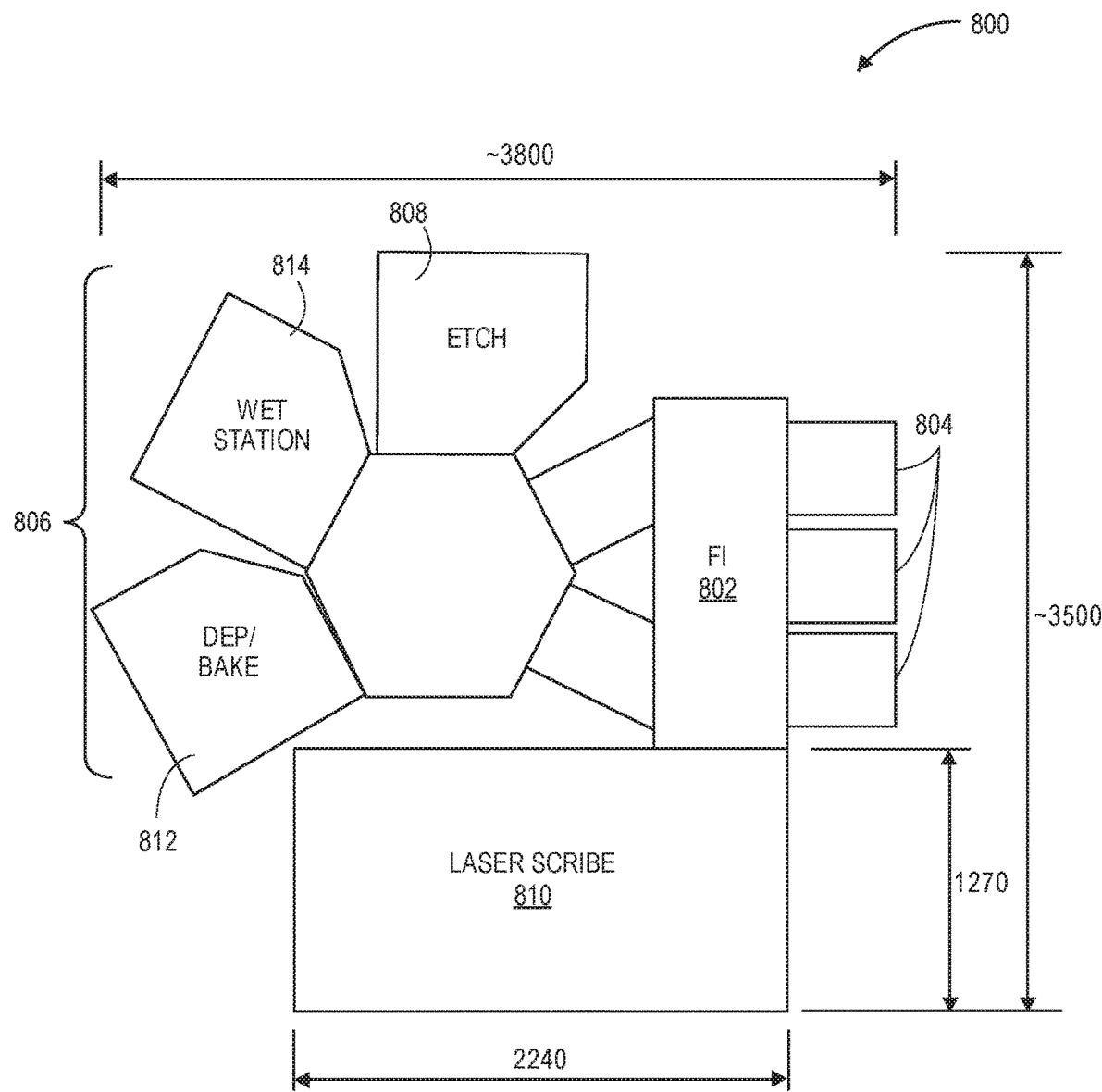
FIG. 8 illustrates a block diagram of a tool layout for laser and plasma dicing of wafers or substrates, in accordance with an embodiment of the present disclosure.

Referring to FIG. 8, a process tool 800 includes a factory interface 802 (FI) having a plurality of load locks 804 coupled therewith. A cluster tool 806 is coupled with the factory interface 802. The cluster tool 806 includes one or more plasma etch chambers, such as plasma etch chamber 808. A laser scribe apparatus 810 is also coupled to the factory interface 802. The overall footprint of the process tool 800 may be, in one embodiment, approximately 3500 millimeters (3.5 meters) by approximately 3800 millimeters (3.8 meters), as depicted in FIG. 8.

In an embodiment, the laser scribe apparatus 810 houses a laser assembly configured to provide a laser beam. In one such embodiment, the laser assembly is configured to provide machine vision capabilities suitable for measuring an offset of scribe lines relative to the streets between dies. In an embodiment, the laser scribe apparatus 810 is configured to provide offset measurements for all of the laser scribe lines on a wafer. In an embodiment, the laser assembly includes a Gaussian source laser beam. In an embodiment, the laser assembly includes a femto-second source laser beam.

In an embodiment, the laser is suitable for performing a laser ablation portion of a hybrid laser and etch singulation process, such as the laser ablation processes described above. In one embodiment, a moveable stage is also included in laser scribe apparatus 810, the moveable stage configured for moving a wafer or substrate (or a carrier thereof) relative to the laser. In a specific embodiment, the laser is also moveable. The overall footprint of the laser scribe apparatus 810 may be, in one embodiment, approximately 2240 millimeters by approximately 1270 millimeters, as depicted in FIG. 8.

In an embodiment, the one or more plasma etch chambers 808 is configured for etching a wafer or substrate through the gaps in a patterned mask to singulate a plurality of integrated circuits. In one such embodiment, the one or more plasma etch chambers 808 is configured to perform a deep silicon etch process. In a specific embodiment, the one or more plasma etch chambers 808 is an Applied Centura® Silvia™ Etch system, available from Applied Materials of Sunnyvale, CA, USA. The etch chamber may be specifically designed for a deep silicon etch used to create singulate integrated circuits housed on or in single crystalline silicon substrates or wafers. In an embodiment, a high-density plasma source is included in the plasma etch chamber 808 to facilitate high silicon etch rates. In an embodiment, more than one etch chamber is included in the cluster tool 806 portion of process tool 800 to enable high manufacturing throughput of the singulation or dicing process.

The factory interface 802 may be a suitable atmospheric port to interface between an outside manufacturing facility with laser scribe apparatus 810 and cluster tool 806. The factory interface 802 may include robots with arms or blades for transferring wafers (or carriers thereof) from storage units (such as front opening unified pods) into either cluster tool 806 or laser scribe apparatus 810, or both.

Cluster tool 806 may include other chambers suitable for performing functions in a method of singulation. For example, in one embodiment, in place of an additional etch chamber, a deposition chamber 812 is included. The deposition chamber 812 may be configured for mask deposition on or above a device layer of a wafer or substrate prior to laser scribing of the wafer or substrate. In one such embodiment, the deposition chamber 812 is suitable for depositing a photo-resist layer. In another embodiment, in place of an additional etch chamber, a wet/dry station 814 is included. The wet/dry station may be suitable for cleaning residues and fragments, or for removing a mask, subsequent to a laser scribe and plasma etch singulation process of a substrate or wafer. In yet another embodiment, in place of an additional deep silicon etch chamber, a plasma etch chamber is included and is configured for performing a plasma-based cleaning process. In an embodiment, a metrology station is also included as a component of process tool 800.

Embodiments of the present disclosure may be provided as a computer program product, or software, that may include a machine-readable medium having stored thereon instructions, which may be used to program a computer system (or other electronic devices) to perform a process according to embodiments of the present disclosure. In one embodiment, the computer system is coupled with process tool 800 described in association with FIG. 8. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 9:
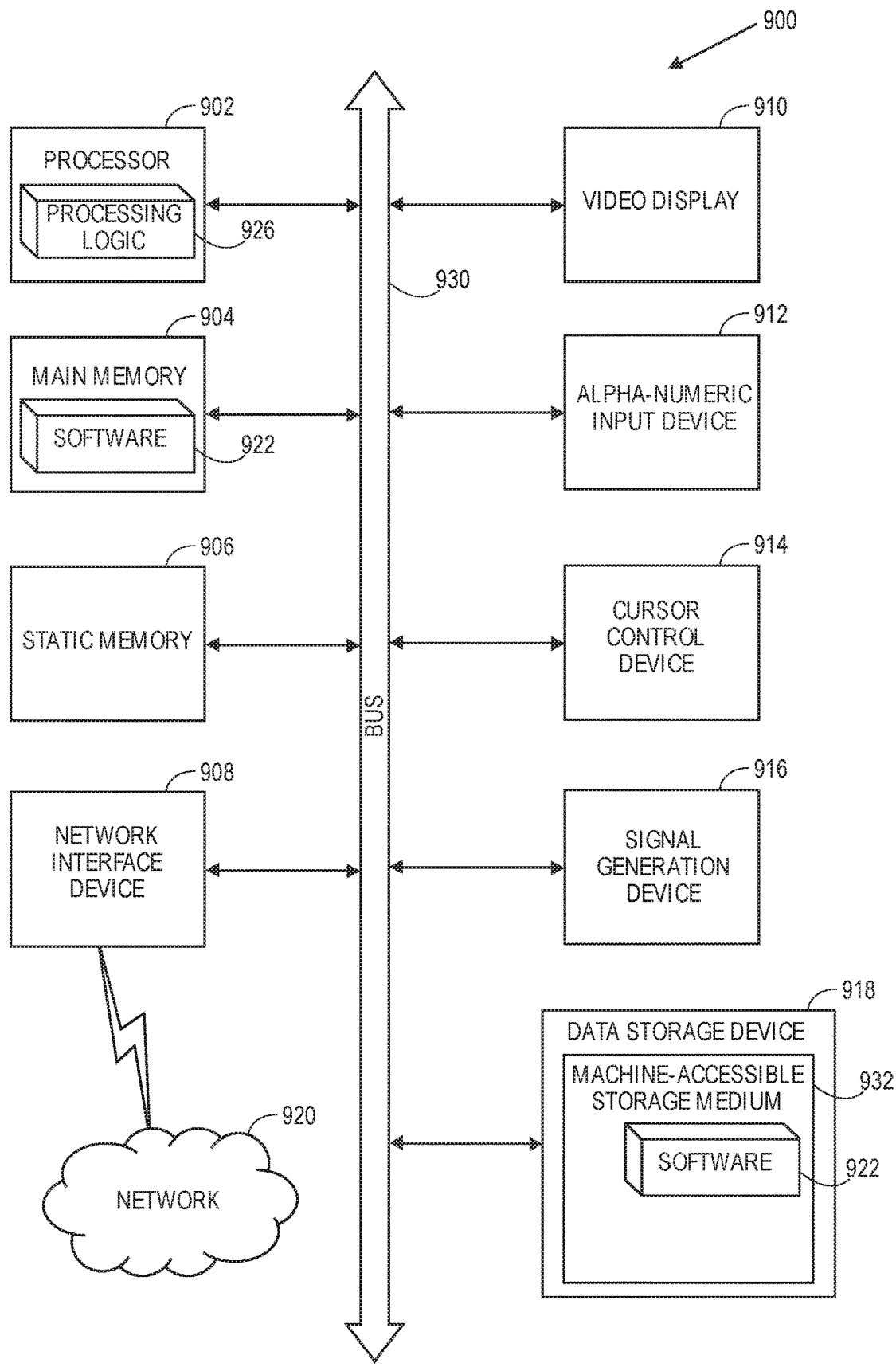
FIG. 9 illustrates a block diagram of an exemplary computer system, in accordance with an embodiment of the present disclosure.

FIG. 9 illustrates a diagrammatic representation of a machine in the exemplary form of a computer system 900 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), MRAM, etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 932 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

While the machine-accessible storage medium 932 is shown in an exemplary embodiment to be a single medium, the term "machine-readable storage medium" should be taken to include a single medium or multiple media (e.g., a centralized or distributed database, and/or associated caches and servers) that store the one or more sets of instructions.

The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of dicing a semiconductor wafer having a plurality of integrated circuits. The method includes forming a mask above the semiconductor wafer, the mask composed of a layer covering and protecting the integrated circuits. The mask is then patterned with a laser scribing process, wherein the patterning provides openings in the streets. In an embodiment, the mask is removed, and scribing offsets of the openings relative to the streets are measured. The measured offsets may then be used in the dicing of subsequent wafers.

Thus, hybrid wafer dicing approaches using offset mapping of a laser scribe line in a laser beam and plasma etch process have been disclosed.

What is claimed is:

1. A method of determining scribing offsets, comprising:
forming a mask above a semiconductor wafer, wherein the semiconductor wafer comprises a plurality of dies separated from each other by streets;
patterning the mask and the semiconductor wafer with a laser scribing process, wherein the patterning provides openings in the streets, wherein one or more of the openings comprises an S-shaped pattern;
removing the mask;
subsequent to removing the mask, measuring scribing offsets of the openings relative to the streets by measuring an offset at a plurality of locations along the S-shaped pattern and determining an average offset, the average offset including both a translational offset and an angular offset; and
using the average offset as an offset correction for processing a subsequent semiconductor wafer.

2. The method of claim 1, wherein measuring the scribing offsets comprises measuring an offset of all of the openings on the semiconductor wafer.

3. The method of claim 1, further comprising:
calculating an offset correction; and
storing the offset correction.

4. The method of claim 3, wherein the offset correction is used to update a wafer map used in scribing processes of subsequent semiconductor wafers.

5. The method of claim 1, wherein the semiconductor wafer is a production wafer.

6. The method of claim 1, wherein the semiconductor wafer is a short-loop wafer.

7. The method of claim 6, wherein the short-loop wafer comprises bumping and die dimensions that are the same as a production wafer.

8. A method of singulating a semiconductor wafer, comprising:
determining an offset correction by laser scribing a first semiconductor wafer having a first mask thereon, the laser scribing forming one or more of the openings having an S-shaped pattern, and measuring scribing offsets in the first semiconductor wafer subsequent to removing the first mask by measuring an offset at a plurality of locations along the S-shaped pattern and determining an average offset, the average offset including both a translational offset and an angular offset;

forming a second mask above a second semiconductor wafer, wherein the second semiconductor wafer comprises a plurality of dies separated from each other by streets; and patterning the second mask and second semiconductor wafer with a laser scribing process that utilizes a wafer map that has integrated the offset correction, wherein the patterning provides openings through the second mask and into the streets of the second semiconductor wafer.

9. The method of claim 8, wherein the laser scribing process singulates the dies of the second semiconductor wafer.

10. The method of claim 8, further comprising:

plasma etching the second semiconductor wafer through the openings, wherein the plasma etching singulates the dies of the second semiconductor wafer.

* * * * *